United States Patent  (10) Patent No.: US 12,126,253 B2
Liu  (45) Date of Patent: Oct. 22, 2024

(54) IN-CIRCUIT DETECTION OF EARLY FAILURE OF POWER SWITCH TRANSISTORS IN SWITCHING POWER CONVERTERS

(71) Applicant: DIALOG SEMICONDUCTOR INC., Campbell, CA (US)

(72) Inventor: Wenduo Liu, Campbell, CA (US)

(73) Assignee: DIALOG SEMICONDUCTOR INC.

(*) Notice: Subject to any disclaimer, the term of this patent is extended or adjusted under 35 U.S.C. 154(b) by 347 days.

(21) Appl. No.: 17/579,308

(22) Filed: Jan. 19, 2022

(65) Prior Publication Data

US 2023/0231468 A1 Jul. 20, 2023

(51) Int. Cl.
*H02M 1/32* (2007.01)
*H02M 1/08* (2006.01)
*H02M 1/44* (2007.01)
*H02M 3/335* (2006.01)
*H03K 17/18* (2006.01)

(52) U.S. Cl.
CPC ............... *H02M 1/32* (2013.01); *H02M 1/08* (2013.01); *H02M 1/44* (2013.01); *H02M 3/33507* (2013.01); *H03K 17/18* (2013.01)

(58) Field of Classification Search
CPC ............ H02M 1/32; H02M 1/08; H02M 1/44; H02M 3/33507; H03K 17/18; H03K 17/0822; H03K 2217/0027
See application file for complete search history.

(56) References Cited

U.S. PATENT DOCUMENTS

| 10,215,795 | B1* | 2/2019 | Zannoth | H03K 17/18 |
| 2013/0187656 | A1* | 7/2013 | Barrenscheen | H03K 17/28 |
| | | | | 324/415 |
| 2017/0192049 | A1* | 7/2017 | Tavernier | H03K 17/18 |
| 2019/0101585 | A1* | 4/2019 | Marques Martins | ............. |
| | | | | H01L 29/7848 |
| 2019/0296730 | A1* | 9/2019 | Ogura | H02M 1/08 |
| 2021/0255235 | A1* | 8/2021 | Graf | G01R 31/2608 |
| 2023/0170892 | A1* | 6/2023 | Krug | H03K 17/18 |
| | | | | 361/93.1 |

* cited by examiner

*Primary Examiner* — Kyle J Moody
*Assistant Examiner* — Jye-June Lee
(74) *Attorney, Agent, or Firm* — .Haynes and Boone, LLP

(57) ABSTRACT

A failure detection circuit for a power switch transistor in a power switching converter is provided that compares a drive voltage for driving a gate of the power switch transistor to a plurality of thresholds. Based upon when the drive voltage crosses each threshold in the plurality of thresholds, a logic circuit determines whether a fault condition exists for the power switch transistor.

15 Claims, 5 Drawing Sheets

IN-CIRCUIT DETECTION OF EARLY FAILURE OF POWER SWITCH TRANSISTORS IN SWITCHING POWER CONVERTERS

TECHNICAL FIELD

This application relates to switching power converters, and more particularly to an in-circuit detection of early failure of power switch transistors in switching power converters.

BACKGROUND

During operation of a switching power converter, a controller controls the switching of a power switch transistor connected to an inductor. For example, the power switch transistor in a flyback converter has a drain terminal connected to a primary winding of a transformer. Prior to the power switch transistor being switched on in a flyback converter, its drain is charged to (or above) the input voltage to the primary winding. The input voltage is rectified from the AC mains and can thus be more than 100 V. The relatively small bandgap of silicon-based power switch transistors requires a silicon-based power switch transistor in a high voltage environment such as a flyback converter to have a relatively large critical thickness, which leads to an increased on-resistance. To lower the conduction losses, it is known to increase the size of silicon-based power switch transistors. But the large size then leads to increased gate capacitance and associated losses and high frequency switching issues. In addition, the relatively small bandgap leads to relatively high leakage currents.

To address the performance issues associated with silicon-based power switch transistors, switching power converters with relatively high bandgap power switch transistors (e.g., GaN high electron mobility (HEMT) or silicon carbide devices) have been developed. But the manufacturing technology for high bandgap devices is not as well developed as that for silicon-based devices, which leads to reliability issues for switching power converters that adopt the use of a high bandgap power switch transistor. For example, the gate of a power switch transistor is vulnerable to voltage spikes during assembly and handling. A high bandgap power switch transistor may then gradually degenerate towards failure, leading to an undesirable failure of an electronic system including the high bandgap switching power converter.

Accordingly, there is a need in the art for a switching power converter with an in-circuit detection of early failures of the switching power transistor.

SUMMARY

In accordance with a first aspect of the disclosure, a switching power converter is provided that includes: a gate driver circuit configured to provide an output voltage at an output terminal for driving a gate of a power switch transistor; a first comparator configured to compare output voltage to a first threshold voltage to provide a first comparator output signal; a second comparator configured to compare the output voltage to a second threshold voltage to provide a second comparator output signal; and a logic circuit configured to detect a fault condition of the power switch transistor based upon the first comparator output signal and the second comparator output signal.

In accordance with a second aspect of the disclosure, a switching power converter method is provided that includes the act of: determining when an output voltage from a gate driver circuit exceeds a plurality of threshold voltages while the gate driver circuit switches on a power switch transistor using the output voltage to provide a plurality of determinations; and detecting a fault condition of the power switch transistor based upon the plurality of determinations.

In accordance with a third aspect of the disclosure, a switching power converter is provided that includes: an inductor; a power switch transistor having a terminal coupled to the inductor; a drive circuit configured to drive a gate of the power switch transistor with a drive voltage to control a cycling of the power switch transistor; and a failure detection circuit configured to compare the drive voltage to a plurality of threshold voltages to detect a fault condition of the power switch transistor.

These and other aspects of the invention will become more fully understood upon a review of the detailed description, which follows. Other aspects, features, and embodiments will become apparent to those of ordinary skill in the art, upon reviewing the following description of specific, exemplary embodiments in conjunction with the accompanying figures.

While features may be discussed relative to certain embodiments and figures below, all embodiments can include one or more of the advantageous features discussed herein. In other words, while one or more embodiments may be discussed as having certain advantageous features, one or more of such features may also be used in accordance with the various embodiments discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

High bandgap power switch transistors have desirable properties such as reduced on-resistance, lower leakage, and improved high frequency performance as compared to the use of silicon-based power switch transistors in switching power converters. But the use of high bandgap power switch transistors has been hampered by reliability issues. To address these reliability issues, a power switch monitoring circuit is disclosed herein that is configured to in-circuit monitor the gate voltage of working high bandgap power switch transistors to detect reliability issues before the power switch transistor transitions to complete failure. Although this monitoring circuit is disclosed with respect to the monitoring of high bandgap power switch transistors, it will be appreciated that the monitoring circuit disclosed herein is also applicable to the monitoring of the reliability of silicon-based power switch transistors.

Figure 1:
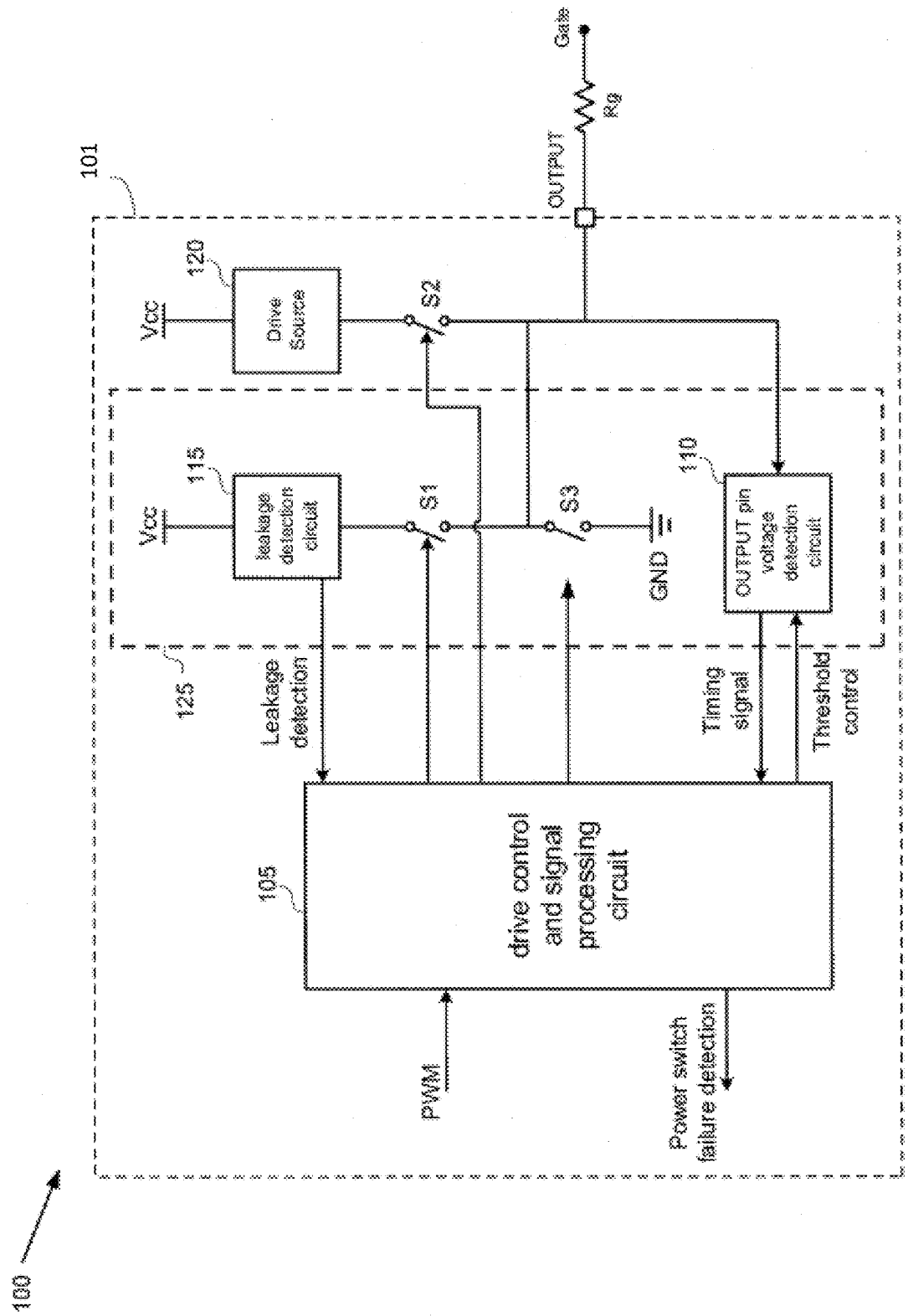
FIG. 1 illustrates a portion of a switching power converter including a controller configured to detect failure conditions of the power switch transistor in accordance with an aspect of the disclosure.

Since it is the gate voltage that is monitored to determine the reliability of the power switch transistor, it is convenient for the monitoring circuit to be integrated with the power switch controller. However, it will be appreciated that separate integrated circuits may be used to construct the power switch controller and monitoring circuit in alternative embodiments. An example switching power converter 100 is shown in FIG. 1 that includes a power switch controller 101 having a monitoring circuit 125. Controller 101 also includes a drive control and signal processing circuit 105 that responds to monitoring circuit 125 while controller 101 controls a gate driver circuit 120 to control the gate drive (and thus the switching of) a power switch transistor (not illustrated). For example, in a pulse width modulation (PWM) mode of operation, drive control and signal processing circuit 105 may control the on-time duration of the power switch transistor responsive to a PWM control signal to regulate an output voltage and/or an output current being applied to a load (not illustrated).

To switch the power switch transistor on, drive control circuit 105 closes a switch S2 to couple an output terminal (OUTPUT) to the gate driver circuit 120. Gate driver circuit 120 is either a voltage source or a current source so that the output terminal voltage is driven to a voltage power supply voltage Vcc after switch S2 has been closed for a sufficiently long period or duration. The output terminal couples through a gate resistor Rg to the gate of the power switch transistor. The gate of the power switch transistor is thus also charged to the power supply voltage Vcc when switch S2 is closed, which causes the power switch transistor to cycle on. When the desired on-time for the power switch transistor has been reached such as established by the PWM control signal, drive control circuit 105 opens switch S2 and closes a switch S3 to ground the gate of the power switch transistor to switch the power switch transistor off.

Monitoring circuit 125 may also be denoted as a failure detection circuit 125 herein in that it functions to detect a failure (or an impending failure) of the power switch transistor. Failure detection circuit 125 includes a leakage detection circuit 115 that is enabled by drive control circuit 105 though the closure of a switch S1 when the power switch transistor is in an on state and any gate current through gate resistor Rg has reduced to zero or sufficiently close to zero. Leakage detection circuit 115 is configured to compare the detected leakage current to a leakage threshold value. If the detected leakage current exceeds the leakage threshold value, leakage detection circuit 115 asserts a leakage detection signal to report the excessive leakage to driver control and signal processing circuit 105.

Failure detection circuit 125 also includes an output voltage detection circuit 110 that compares the voltage of the output terminal OUT driving the gate of the power switch transistor through the gate resistor Rg to various thresholds as received from drive control and signal processing circuit 105 to determine a reliability of the power switch transistor. Based upon the threshold comparisons to the output voltage, output voltage detection circuit 110 reports a timing signal that identifies the length of various periods of operation during the switching on of the power switch transistor to the drive control and signal processing circuit 105. Based upon the length or duration of the various periods of operation that occur during the switching on of the power switch transistor, drive control circuit 105 may determine a reliability of the power switch transistor.

Figure 2:
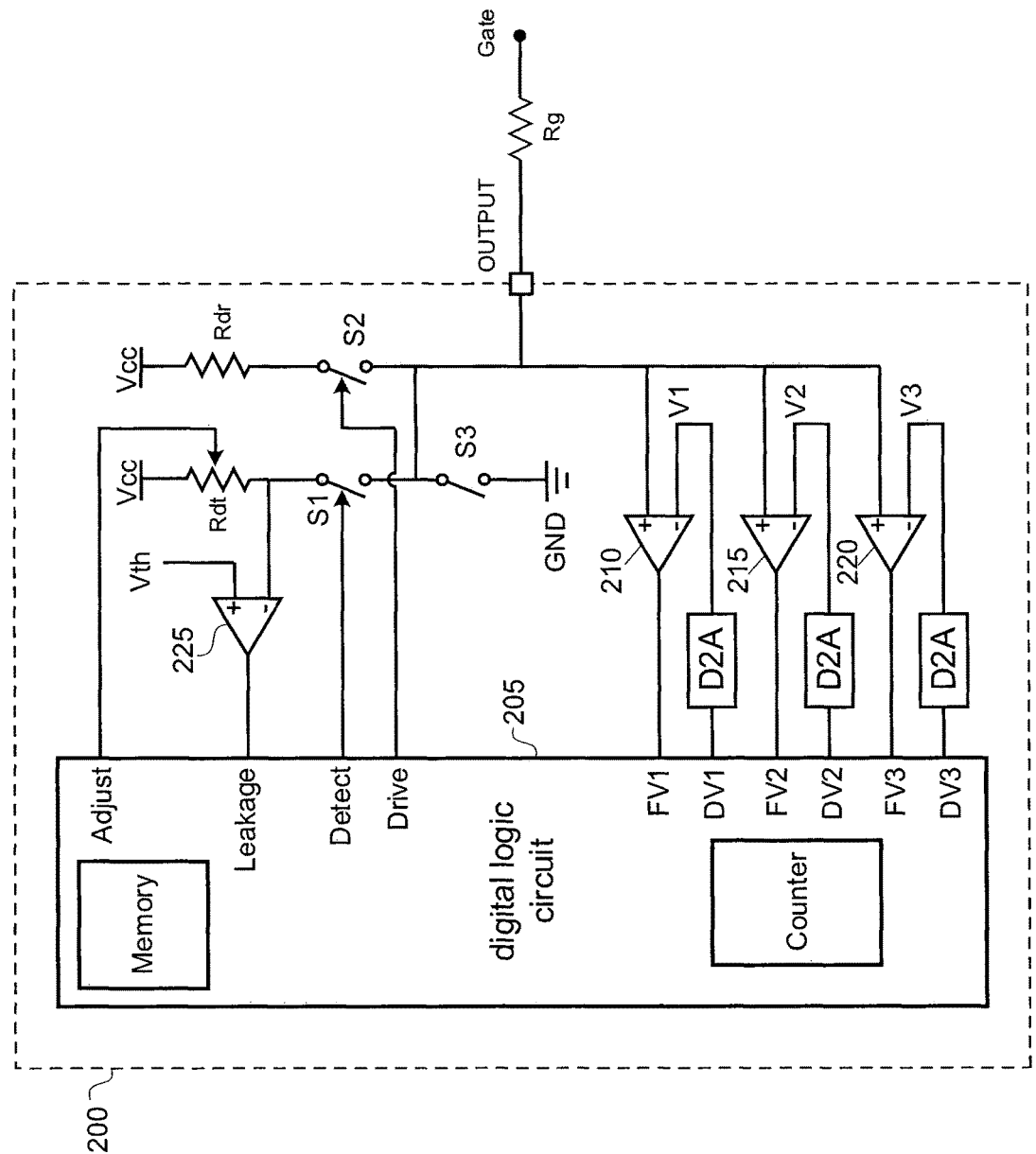
FIG. 2 illustrates an embodiment of the controller of FIG. 1 in which the driver circuit of the gate voltage of the power switch transistor is a voltage source in accordance with an aspect of the disclosure.

The gate driver circuit 120 may be either a voltage source or a current source as discussed earlier. An example controller 200 in which the gate driver circuit is a voltage source as formed by a node for the power supply voltage Vcc and a drive resistor Rdr is shown in FIG. 2. When switch S2 closes, the voltage source charges the output terminal OUT to the power supply voltage Vcc. The drive control circuit 105 (FIG. 1) includes a digital logic circuit 205 as shown in FIG. 2 for interfacing with the leakage detection circuit and the output voltage detection circuit. In controller 200, the leakage detection circuit is formed by a comparator 225 that compares a voltage across a resistor (e.g., a variable leakage detection resistor Rdt) to a leakage threshold voltage Vth. When comparator 225 asserts its output signal (the leakage detection signal), digital logic circuit 205 is alerted to the detection of the threshold leakage current at the gate of the power switch transistor. This leakage detection occurs during the switching on of the power switch transistor after switch S2 is opened. By adjusting the resistance of variable leakage detection resistor Rdt and/or the value of the leakage threshold voltage, digital logic circuit 205 may control the amount of leakage current that will trigger a threshold leakage detection.

The output voltage detection circuit in controller 200 is formed by three comparators 210, 215, and 220, which may also be denoted herein a first comparator, a second comparator, and a third comparator, respectively. As will be explained further herein, the timing of a corresponding period during the switching on of the power switch transistor (not illustrated) is determined by when each comparator asserts its output signal. Comparator 210 determines when a first period T1 has terminated during the cycling on of the power switch transistor. Similarly, comparator 215 when a second period T2 that follows first period T1 has terminated during the cycling on of the power switch transistor. Finally, comparator 220 determines when a third period T3 that follows period T2 has terminated during the cycling on of the power switch transistor. In response to at least one of the timing of periods T1, T2, and T3, digital logic circuit 205 determines a reliability of the power switch transistor.

Each of comparators 210, 215, and 220 detects the end of its respective period by comparing the output voltage to a respective threshold voltage. For example, digital logic circuit 205 may provide a digital word DV1 to a first digital-to-analog (D2A) converter to generate a first threshold voltage V1. When the output voltage exceeds the first threshold voltage V1, comparator 210 asserts its output signal FV1, which may also be denoted herein as a first comparator output signal. Similarly, digital logic circuit 205 may provide a digital word DV2 to a second digital-to-analog (D2A) converter to generate a second threshold voltage V2. When the output voltage exceeds the second threshold voltage V2, comparator 215 asserts its output signal FV2, which is also denoted herein as a second comparator output signal. Finally, digital logic circuit 205 may provide a digital word DV3 to a third digital-to-analog (D2A) converter to generate a third threshold voltage V3. When the output voltage exceeds the third threshold voltage V3, comparator 220 asserts its output signal FV3, which may also be denoted herein as a third comparator output signal.

Figure 3:
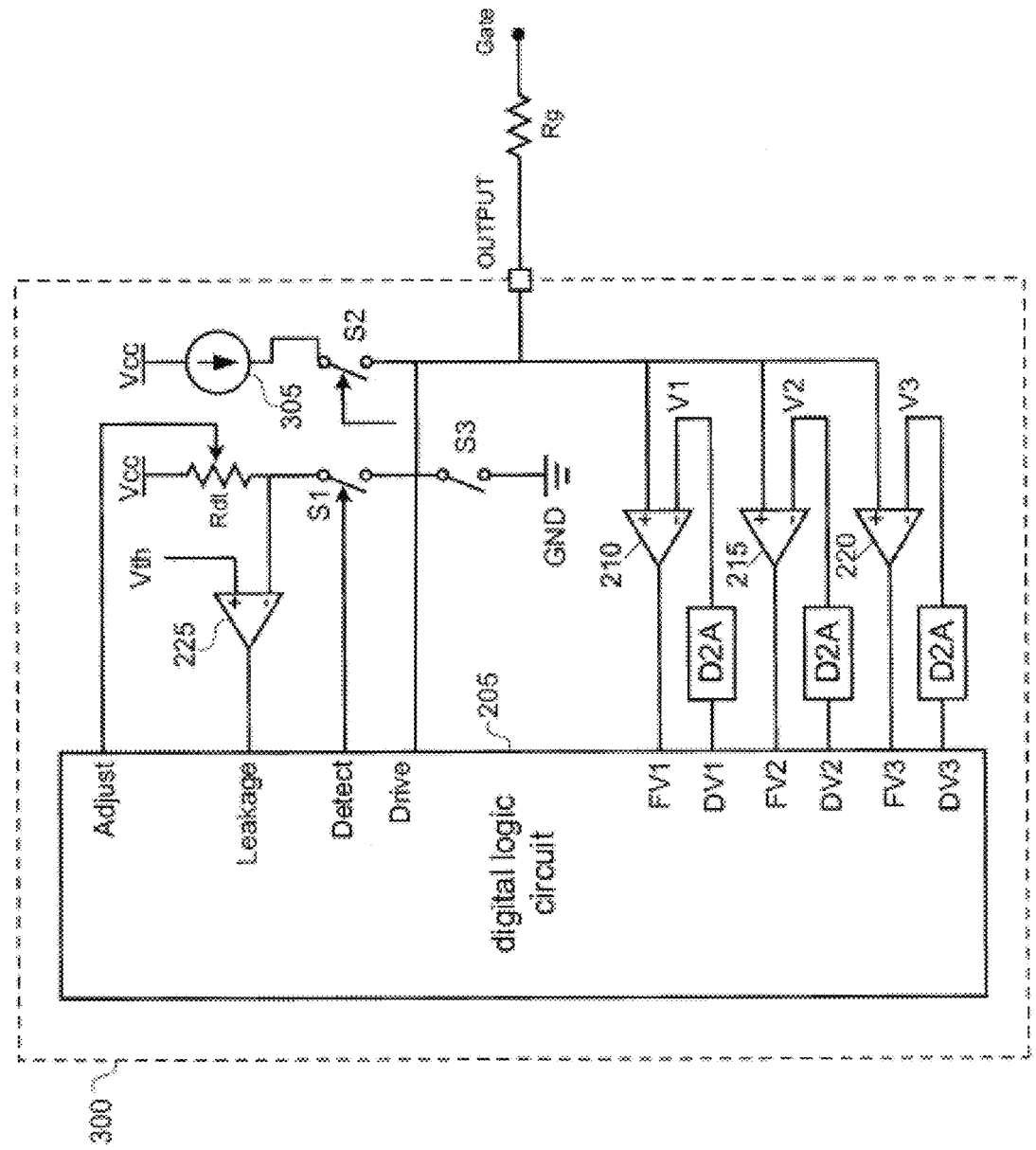
FIG. 3 illustrates an embodiment of the controller of FIG. 1 in which the driver circuit of the gate voltage of the power switch transistor is a current source in accordance with an aspect of the disclosure.

An example controller 300 in which the driver circuit is a current source 305 that charges the output terminal OUT with a current when switch S2 is closed is shown in FIG. 3. All the remaining components of controller 300 may be constructed as discussed for controller 200.

Figure 4:
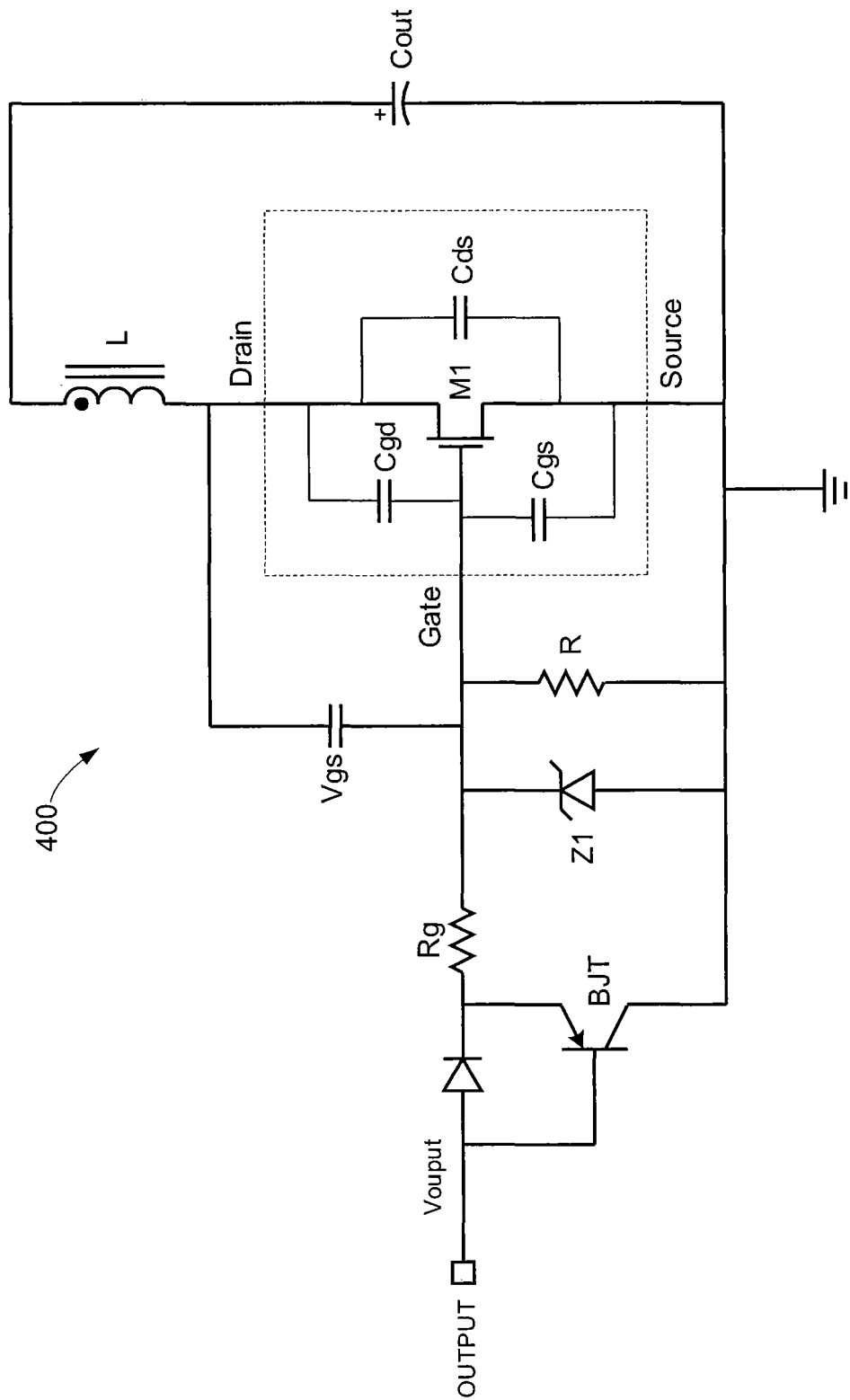
FIG. 4 illustrates a driver circuit portion of the switching power converter of FIG. 1 as well as the power switch transistor and a switching power converter inductor in accordance with an aspect of the disclosure.

As discussed previously, the drain voltage of a power switch transistor in a flyback converter is exposed to relatively high voltages (e.g., in excess of 100 V) when the power switch is cycled off. But then the power switch is cycled on, the drain voltage is discharged to ground. This relatively high rate of change (dV/dt) of the drain voltage during the cycling of the power switch transistor may cause excessive electromagnetic interference (EMI). To reduce the EMI, a controller such as any of controllers 100, 200, or 300 may drive the gate of the power switch transistor through an EMI-reducing drive circuit. An example drive circuit 400 for driving a gate of a power switch transistor M1 having a drain coupled to an inductor L of the switching power converter (e.g., switching power converter 100 of FIG. 1) is shown in FIG. 4. Should the switching power converter be a flyback converter, inductor L is the primary winding of the flyback's transformer. Alternatively, inductor L may be the inductor in a DC-DC switching power converter such as a buck converter, a boost converter, or a buck-boost converter. An output capacitor Cout for smoothing an output voltage to a load (not illustrated) couples between an output terminal of the inductor L and ground. The output terminal OUT from the controller (not illustrated) couples through a diode to the gate resistor Rg that in turn couples to the gate of the power switch transistor M1. Power switch transistor M1 may be a wideband gap power transistor such as a GaN HEMT or silicon carbide transistor. Alternatively, power switch transistor M1 may be a silicon-based MOSFET.

A parallel combination of a Zener diode Z1 and a pulldown resistor R couples between the gate of the power switch transistor M1 and ground. A Miller compensation capacitor CMiller couples between the gate and drain of the power switch transistor M1. For conceptual purposes, the parasitic gate-to-drain capacitance (Cgd), the parasitic gate-to-source capacitance (Cgs), and the parasitic drain-to-source capacitance (Cds) of the power switch transistor M1 are also shown in FIG. 4. The emitter of a bipolar junction transistor (BJT) couples to a node between a the diode D1 and the gate resistor Rg. A collector of the BJT couples to ground whereas its base couples to the output terminal OUT.

Note that the drive circuit may vary in alternative embodiments. The reliability monitoring of the power switch transistor disclosed herein is thus independent on the construction or configuration of the drive circuit. For example, the drive circuit may consist merely of the gate resistor Rg in alternative implementations. Given the presence of the drive circuit (e.g., drive circuit 400), the voltage detection circuit in controllers 100, 200, or 300 may not be able to directly detect the gate voltage Vgs of the power switch transistor. Instead, only the drive voltage at the output terminal OUT may be directly detected. Digital logic circuit 205 may thus adjust the digital words DV1, DV2, and DV3 to adjust the threshold voltages used to time periods T1, T2, and T3 to account for the effects of drive circuit 400 converting the drive voltage into the gate voltage Vgs.

Figure 5:
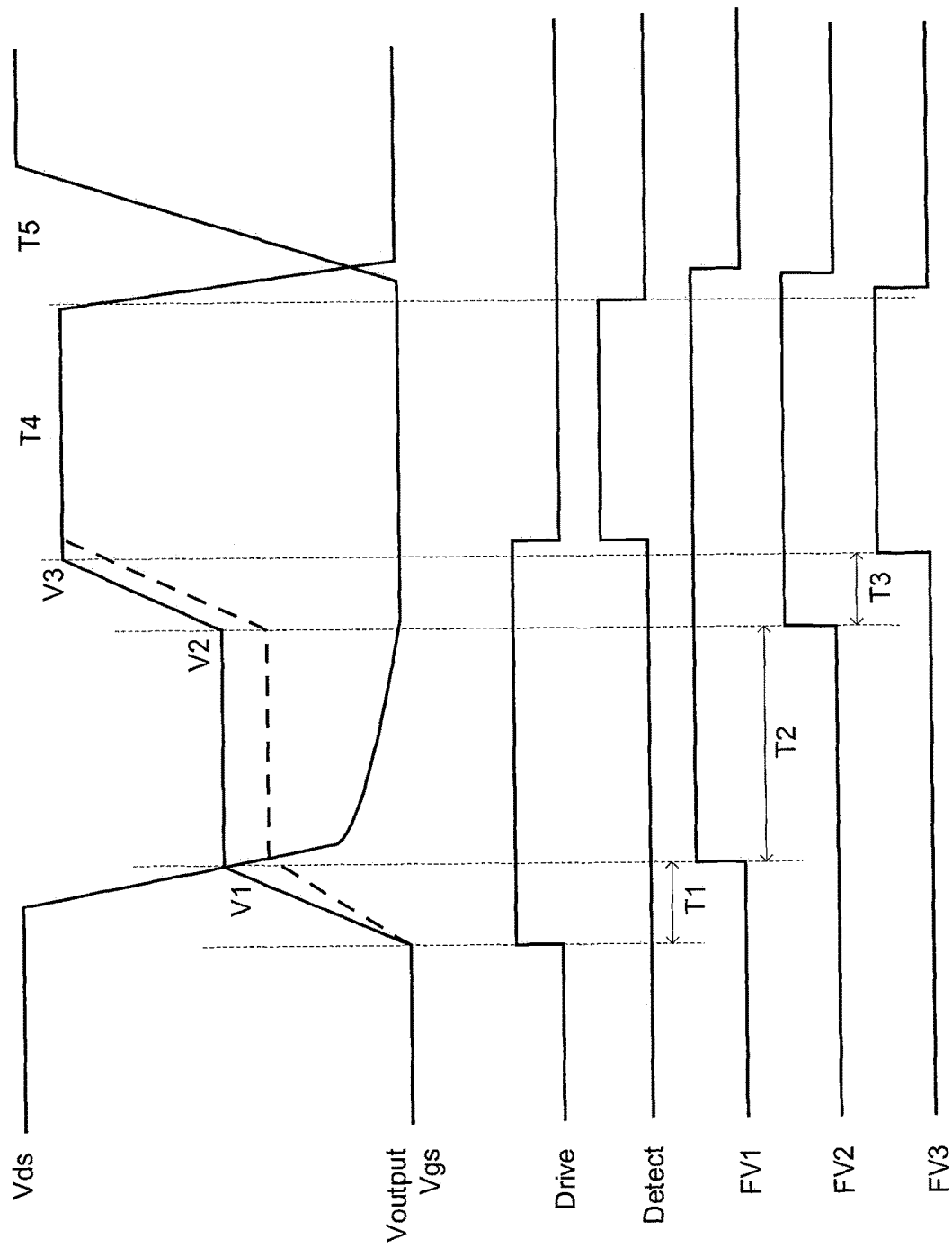
FIG. 5 illustrates some operating waveforms for a controller configured to detect failure conditions of the power switch transistor in accordance with an aspect of the disclosure.

Regardless of whether the gate driver circuit is a voltage source or a current source, some example waveforms during the cycling on of the power switch transistor are shown in FIG. 5. Referring again to FIG. 2, digital logic circuit 205 may include a counter that begins counting responsive to cycles of a clock signal when switch S2 is closed to begin the cycling on of the power switch transistor. A drive signal controls whether switch S2 is closed. As shown in FIG. 5, the drive signal is asserted to begin the timing of the first period T1. At this initiation of the cycling on of the power switch transistor, the counter is counting (and thus timing) first period T1. The output terminal voltage (Voutput) begins to rise relatively rapidly at the beginning of first period T1. But due to the effects of drive circuit 400, the gate voltage Vgs of the power switch transistor rises at a slightly lower rate than Voutput. The output terminal voltage Voutput (which is also denoted herein as the drive voltage) is indicated with a solid line in FIG. 5 whereas the gate voltage Vgs of the power switch transistor is indicated with a dotted line.

The gate voltage continues to rise in first period T1 until the power switch transistor is sufficiently on such that the power switch transistor begins to discharge its parasitic gate-to-drain capacitance Cdg. This parasitic capacitance behaves non-linearly such that it increases as the power switch transistor continues to discharge it. The gate voltage Vgs of the power switch transistor then enters its Miller plateau period (denoted as a second period T2 herein) at the end of first period T1 due to the discharge of this non-linear capacitance. The gate voltage Vgs is constant during the second period T2, which ends when the parasitic capacitance Cdg has been completely discharged.

To detect the end of first period T1, digital logic circuit 205 appropriately sets the threshold V1 for comparator 210 such that comparator 210 asserts its output signal FV1 at the end of period T1 when the Miller plateau (second period T2) begins. The count of the counter when output signal FV1 is asserted represents the length of period T1. As shown in FIG. 4, threshold V1 is higher than the Vgs Miller plateau voltage due to the effects of drive circuit 400. The counter then begins second timing period T2 when the output voltage Voutput exceeds threshold V1

The threshold voltage V2 is slightly higher than the output voltage Voutput during second period T2. Comparator 215 asserts its output signal FV2 when the output voltage Voutput has exceeded threshold voltage V2, to end the timing of second period T2 and begin the timing of third period T3. During third period T3, the gate voltage Vgs rises relatively rapidly to the power supply voltage, whereupon the power switch transistor is fully on. The drain-to-source voltage Vds of the power switch transistor, which had sharply decreased during first period T1 and then more slowly decreased during second period T1 is then discharged completely to ground during third period T3. To detect the termination of third period T3, digital logic circuit 205 sets threshold V3 to be slightly less than the power supply voltage. As the output terminal voltage Voutput rises above threshold V3, comparator 225 asserts its output signal FV3 to stop the timing of third period T3.

A fourth period T4 then extends from third period T3 during which the power switch transistor is completely on. During a fifth period T5, switch S3 is switched on to discharge the gate voltage Vgs and switch off the power switch transistor. An on/off switching cycle of the power switch transistor may thus be divided into the five periods T1 through T5.

For a normally operating power switch transistor, the durations of periods T1, T2, and T3 depend upon the relative strength of the gate drive circuit (the voltage source or the current source), the power switch transistor, and the impedance of driver circuit 400. Since these factors are known, digital logic circuit 205 may then determine if the T1, T2, and T3 measurements correspond sufficiently to the expected values. If the gate terminal of the power switch transistor has an excessive leakage current, periods T1, T2, and T3 will be longer than expected. Digital logic circuit 205 may then assert a power switch failure detection signal accordingly. Similarly, should the threshold voltage of the power switch transistor be out of range, periods T1, T2, and T3 will also exceed their expected range. Digital logic circuit 205 may then assert the power switch failure signal accordingly.

To adjust the expected durations of periods T1, T2, and T3, the controller may include a memory such as shown within digital logic unit 205 of FIG. 2. For example, the memory may be a fuse memory that a user configures according to the expected values of T1, T2, and T3. A first code (e.g., a two-bit code) in the memory may then control the expected duration of period T1. With two bits, a user may then program the expected duration of period T to one of four possible values. The use of additional bits would allow for a finer granularity in the number of possible values for the duration of period T1. A similar second code and third code stored in the memory may program the expected value of the duration of periods T2 and T3, respectively.

At the end of period T3, the digital logic circuit may switch off switch S2 and switch on S1 to activate the leakage detection circuit. The amount of leakage current that is detected is affected by the drive circuit. For example, pull-down resistor and the Zener diode in drive circuit 400 may conduct current that should be accounted by the leakage detection circuit. If such current was not accounted for, the leakage detection circuit could detect a leakage current fault when such a fault condition is not present. The memory discussed earlier may thus also be programmed with a resistance code to set the resistance of the variable resistor Rdt in the leakage detection circuit in response to the expected current that would be conducted to ground from the gate terminal by components in the drive circuit (e.g., the pull-down resistor R and the Zener diode in drive circuit 400).

Those of some skill in this art will by now appreciate that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A switching power converter, comprising:
a gate driver circuit configured to provide an output voltage at an output terminal for driving a gate of a power switch transistor;
a first comparator configured to compare the output voltage to a first threshold voltage to provide a first comparator output signal;
a second comparator configured to compare the output voltage to a second threshold voltage to provide a second comparator output signal;
a third comparator configured to compare the output voltage to a third threshold voltage to provide a third comparator output signal, and wherein the logic circuit is further configured to detect the fault condition based upon the third comparator output signal; and
a logic circuit configured to detect a fault condition of the power switch transistor based upon the first comparator output signal and the second comparator output signal, wherein the logic circuit is further configured to detect:
a first period beginning when the gate driver circuit begins driving the gate of the power switch transistor and ending responsive to an assertion of the first comparator output signal;
a second period beginning at an end of the first period and ending responsive to an assertion of the second comparator output signal;
a third period beginning at an end of the second period and ending responsive to an assertion of the third comparator output signal, and wherein the third threshold voltage is greater than the second threshold voltage and wherein the second threshold voltage is greater than the first threshold voltage.

2. The switching power converter of claim 1, wherein the logic circuit is further configured to detect the fault condition of the power switch transistor based upon at least one of:
a comparison of a duration of the first period to an expected duration of the first period;
a comparison of a duration of the second period to an expected duration of the second period; and
a comparison of a duration of the third period to an expected duration of the third period.

3. The switching power converter of claim 2, wherein the switching power converter further includes a memory for storing the expected duration of the first period, the expected duration of the second period, and the expected duration of the third period.

4. The switching power converter of claim 3, wherein the logic circuit is further configured to:
adjust the first threshold voltage based upon the expected duration of the first period;
adjust the second threshold voltage based upon the expected duration of the second period; and
adjust the third threshold voltage based upon the expected duration of the third period.

5. The switching power converter of claim 4, further comprising:
a first digital-to-analog converter configured to convert a first code from the logic circuit to provide the first threshold voltage;
a second digital-to-analog converter configured to convert a second code from the logic circuit to provide the second threshold voltage; and
a third digital-to-analog converter configured to convert a third code from the logic circuit to provide the third threshold voltage.

6. The switching power converter of claim 1, further comprising: a leakage detection circuit couplable to the output terminal through a first switch controlled by the logic circuit, and wherein the logic circuit is further configured to close the first switch responsive to an end of the third period and wherein the leakage detection circuit configured to detect a leakage current of the power switch transistor responsive to a closing of the first switch.

7. The switching power converter of claim 6, wherein the leakage detection circuit includes:
a variable resistor coupled in series between the first switch and a node for a power supply voltage, and
a fourth comparator configured to assert a leakage detection signal to the logic circuit in response to a voltage across the variable resistor exceeding a leakage threshold voltage, and wherein the logic circuit is further configured to detect the fault condition responsive to an assertion of the leakage detection signal.

8. A switching power converter control method, comprising: determining when an output voltage from a gate driver circuit exceeds a plurality of threshold voltages while the gate driver circuit switches on a power switch transistor using the output voltage to provide a plurality of determinations; detecting a fault condition of the power switch transistor based upon the plurality of determinations; and detecting a leakage current of the power switch transistor following a last determination in the plurality of determinations.

9. The switching power converter control method of claim 8, wherein determining when the output voltage from the gate driver circuit exceeds the plurality of threshold voltages while the gate driver circuit switches on the power switch transistor using the output voltage comprises: beginning a timing of a first period following a coupling of the gate driver circuit to an output terminal to charge the output terminal with the output voltage to begin switching on the power switch transistor; terminating the timing of the first period when the output voltage exceeds a first threshold voltage in the plurality of threshold voltages; beginning a timing of a second period at a termination of the first period; and terminating the timing of the second period when the output voltage exceeds a second threshold in the plurality of threshold voltages.

10. The switching power converter control method of claim 9, wherein determining when the output voltage from the gate driver circuit exceeds the plurality of threshold voltages while the gate driver circuit switches on the power switch transistor using the output voltage further comprises: beginning a timing of a third period at a termination of the second period; and terminating the timing of the third period when the output voltage exceeds a third threshold in the plurality of threshold voltages.

11. The switching power converter control method of claim 10, detecting the fault condition of the power switch transistor based upon the plurality of determinations is based upon at least one of: a comparison of the first period to an expected duration of the first period; a comparison of the second period to an expected duration of the second period; and a comparison of the third period to an expected duration of the third period.

12. A switching power converter, comprising:
an inductor;
a power switch transistor having a terminal coupled to the inductor;
a drive circuit configured to drive a gate of the power switch transistor with a drive voltage to control a cycling of the power switch transistor;
a failure detection circuit configured to compare the drive voltage to a plurality of threshold voltages to detect a fault condition of the power switch transistor;
a leakage detection circuit coupled to a terminal of the drive voltage through a switch; and
a logic circuit configured to close the switch after a comparison by the failure detection circuit of the drive voltage to a final threshold voltage in the plurality of threshold voltages.

13. The switching power converter of claim 12, wherein the inductor is a primary winding of a transformer and wherein the power switch transistor is a high bandgap power switch transistor.

14. The switching power converter of claim 12, wherein the leakage detection circuit includes:
a resistor coupled between a node for a power supply voltage and the switch; and
a comparator configured to compare a voltage across the resistor to a leakage detection threshold voltage.

15. The switching power converter of claim 14, wherein the resistor is a variable resistor.

* * * * *